United States Patent
Sugimoto et al.

(10) Patent No.: US 7,283,193 B2
(45) Date of Patent: Oct. 16, 2007

(54) WIRING BOARD INTERCONNECTION ARRANGEMENT AND DISPLAY DEVICE INCLUDING SAME

(75) Inventors: Mitsuhiro Sugimoto, Mie (JP); Yohichiroh Sakaki, Mie (JP); Hisao Kawaguchi, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 10/662,453

(22) Filed: Sep. 16, 2003

(65) Prior Publication Data

US 2004/0061825 A1 Apr. 1, 2004

(30) Foreign Application Priority Data

Sep. 17, 2002 (JP) ............................. 2002-269839
Aug. 29, 2003 (JP) ............................. 2003-305592

(51) Int. Cl.
*G02F 1/1345* (2006.01)
*G09G 3/36* (2006.01)

(52) U.S. Cl. ..................... 349/149; 349/150; 345/104

(58) Field of Classification Search ........ 349/149–152; 345/50, 51, 104
See application file for complete search history.

(56) References Cited

U.S. PATENT DOCUMENTS 6,128,063 A * 10/2000 Uchiyama et al. .......... 349/150

6,407,796 B2 6/2002 Tajima et al.
6,639,589 B1 * 10/2003 Kim et al. ................... 345/206
6,686,987 B1 * 2/2004 Sakaki et al. ................ 349/149

FOREIGN PATENT DOCUMENTS

| JP | 3-114820 U | 11/1991 |
|---|---|---|
| JP | 4-313731 A | 11/1992 |
| JP | 2001-56481 A | 2/2001 |
| JP | 2002-287655 A | 10/2002 |

* cited by examiner

*Primary Examiner*—David Nelms
*Assistant Examiner*—Michael H. Caley
(74) *Attorney, Agent, or Firm*—Birch, Stewart, Kolasch & Birch, LLP

(57) ABSTRACT

The display device includes a display panel and a plurality of wiring boards placed along the periphery of the display panel. The display panel has panel-side connection wiring for electrically connecting first and second wiring boards adjacent to each other among the plurality of wiring boards. Each of the plurality of wiring boards has an insulating base, a board-side wiring group running on the insulating base, and at least one driving circuit element for driving the display panel. The board-side wiring group is composed of element-connected wiring electrically connected to the driving circuit element and non-connected wiring having no electrical connection to the driving circuit element. The panel-side connection wiring is formed so that the element-connected wiring of the first wiring board and the non-connected wiring of the second wiring board are electrically connected to each other.

10 Claims, 18 Drawing Sheets

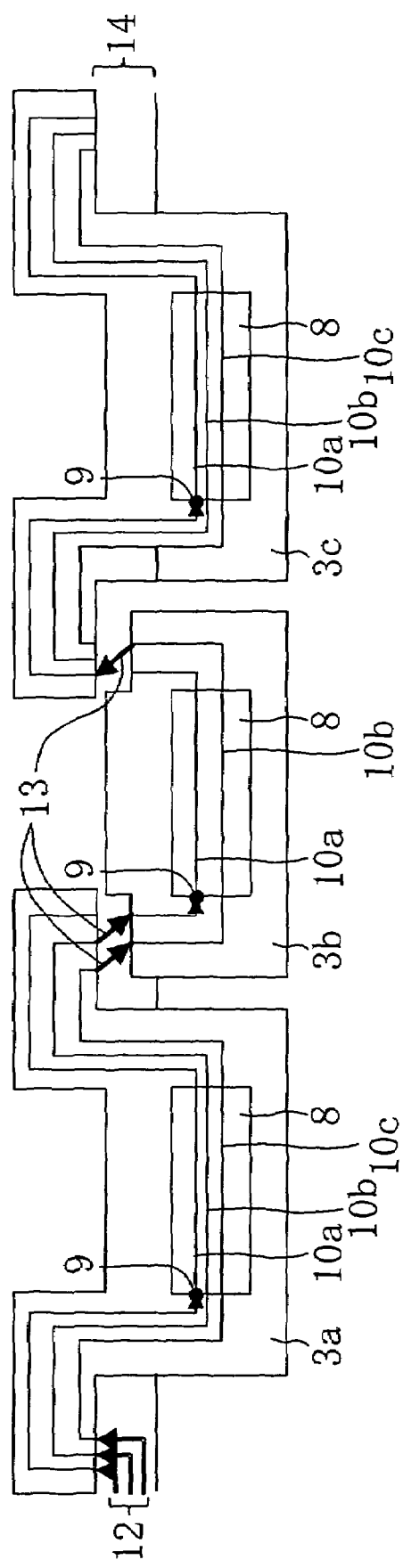

Terminal connecting portion (panel side)

Terminal connecting portion (external circuit board side)

◁·· Signal (data) wiring
◀— Power supply/GND wiring
⇐ Output to panel

◁·· Signal (data) wiring
◀— Power supply/GND wiring
⇐ Output to panel

WIRING BOARD INTERCONNECTION ARRANGEMENT AND DISPLAY DEVICE INCLUDING SAME

This Nonprovisional application claims priority under 35 U.S.C. § 119(a) on Patent Application No(s). 2002-269839 and 2003-305592 tiled in JAPAN on Sep. 17, 2002 and Aug. 29, 2003, the entire contents of which are hereby incorporated by reference.

BACKGROUND OF THE INVENTION

The present invention relates to a display device. The display device of the present invention can be a liquid crystal display device, organic and inorganic electroluminescence (EL) display device, a plasma display device and the like, for example.

Conventionally, in liquid crystal display (LCD) devices, a tape carrier package (TCP) mode is mainly adopted for mounting of liquid crystal (LC) driving ICs to an LC panel. FIG. 17A is a perspective view diagrammatically showing a TCP-mode LCD device. This LCD device, denoted by 500, includes an LC panel 501, and gate TCPs 502, source TCPs 503 and external circuit boards 504 placed along the periphery of the LC panel 501. The gate TCPs 502 and the source TCPs 503 are respectively provided for supplying signals to gate signal lines and source signal lines of the LC panel 501. The external circuit boards 504 are provided for supplying external signals to the gate TCPs 502 and the source TCPs 503.

FIG. 17B is a perspective view diagrammatically showing one gate TCP 502/source TCP 503. Each of the gate TCPs 502 and the source TCPs 503 includes an LC driving IC 505, signal input wiring 507 and signal output wiring 508 formed on a flexible base 506. The signal input wiring 507 supplies external signals, such as image data signals, a power supply voltage for IC driving and a power supply voltage for counter electrode driving, to the LC driving IC 505. The signal output wiring 508 supplies signals output from the LC driving IC 505.

The signal input wiring 507 of each of the gate TCPs 502 and the source TCPs 503 is electrically connected to terminals on the external circuit board 504, which is a printed wiring board (PWB) placed outside the LC panel 501, to lead the external signals to the LC driving IC 505 from the terminals on the external circuit board 504.

FIG. 18 is a view demonstrating signal input of the TCP-mode LCD device. In the LCD device 500, signals are directly input into the individual source TCPs 503, for example, from the external circuit board 504. Therefore, a considerably large number of wiring lines must be formed on the external circuit board 504. To accommodate these wiring lines, some contrivance such as forming the external circuit board 504 as a multilayer structure is necessary, and this causes disadvantages such as complicating the fabrication process, increasing the cost and decreasing the reliability.

To overcome the problem of the conventional TCP mode described above, a "signal propagation mode" has been introduced, in which a signal is once supplied to one TCP and then propagated to the adjacent TCP sequentially. This mode is disclosed in Japanese Laid-Open Patent Publication No. 4-313731, No. 10-214858, No. 2001-056481 and No. 2002-287655 and Japanese Laid-Open Utility Model Publication No. 3-114820, for example.

The signal propagation mode will be described with reference to FIG. 19. FIG. 19 is a view demonstrating signal input of an LCD device adopting the signal propagation mode. Each TCP 601 includes an LC driving IC 602, signal input wiring 603 for supply of an external signal to the LC driving IC 602, signal output wiring 605 for supply of an image signal from the LC driving IC 602 to an LC panel 604, and relay wiring 606 for outputting an LC driving signal to the adjacent TCP 601.

In the LCD device described above, when an external signal is supplied to a first-stage LC driving IC 602a from an external circuit board 607 via the signal input wiring 603, an image signal corresponding to the supplied external signal is sent to the LC panel 604 via the first-stage LC driving IC 602a and the signal output wiring 605. At this time, part of the external signal input into the first-stage LC driving IC 602a is lead to the relay wiring 606, to be supplied to the signal input wiring 603 of the adjacent second-stage TCP 601b via connection wiring 608 running on the LC panel 604.

Therefore, once a signal is input into the first-stage TCP 601a from the external circuit board 607, part of the signal is output to a pixel of the LC panel 604 via the LC driving IC 602a of the TCP 601a. The remainder of the signal is sequentially propagated to the adjacent TCPs 601b, 601c and 601d via the relay wiring 606 of the respective TCPs 601 and the connection wiring 608 on the LC panel 604.

The LCD device of the signal propagation mode using the relay wiring 606 can widely reduce the number of wiring lines required for input of signals from the external circuit board 607 into the TCPs 601a, 601b, 601c and 601d. For the external circuit board 607 on which a large number of wiring lines must be formed, some contrivance such as giving multiple layers is made to accommodate the large number of wiring lines. In this situation, the reduction of the number of wiring lines can reduce the number of layers, and this leads to cost reduction of the external circuit board 607.

However, the wiring structure in the signal propagation mode disclosed in the above-mentioned publications and the like has the following problem. External image signals are input into the LC driving ICs of the respective TCPs via the same wiring line. That is, a composite signal composed of image signals for the respective LC driving ICs in the number equal to the number of TCPs is input into the same wiring line. This inevitably causes increase of the clock frequency and thus adversely affects electromagnetic interference (EMI). Therefore, adopting this wiring structure will be more difficult as the LCD device is higher in definition.

SUMMARY OF THE INVENTION

An object of the present invention is providing a display device capable of suppressing increase of the clock frequency of signals.

The display device of the present invention includes a display panel and a plurality of wiring boards placed along a periphery of the display panel, wherein the display panel has panel-side connection wiring for electrically connecting a first wiring board and a second wiring board adjacent to each other among the plurality of wiring boards, each of the plurality of wiring boards has an insulating base, a board-side wiring group running on the insulating base, and at least one driving circuit element for driving the display panel, the board-side wiring group is composed of element-connected wiring electrically connected to the driving circuit element and non-connected wiring having no electrical connection to the driving circuit element, and the panel-side connection wiring is formed so that the element-connected wiring of the first wiring board and the non-connected wiring of the second wiring board are electrically connected to each other.

The plurality of wiring boards preferably have wiring patterns identical in board-side wiring group.

Preferably, a plurality of lines constituting the board-side wiring group run on the insulating base without crossing each other, the non-connected wiring is in a roughly U shape as viewed from top with both ends at the periphery of the insulating base, and at least one end of the element-connected wiring is located inside or outside both ends of the non-connected wiring at the periphery of the insulating base, or the element-connected wiring is interposed between a plurality of lines of the non-connected wiring.

Preferably, the non-connected wiring has another roughly U shape as viewed from top in at least a portion near one end extending in a direction away from the other end.

Preferably, each of the plurality of wiring boards has n or n+1 sets of lines that constitute the board-side wiring group and are involved in signal transmission where n is the total number of driving circuit elements of the plurality of wiring boards (n is a natural number equal to or more than 2). Note that a "line involved in signal transmission" refers to a line through which a signal to be input into or output from any of the plurality of driving circuit elements of the plurality of wiring boards is transmitted.

Each wiring board may further have board-side spare wiring electrically connected to the driving circuit element, the display panel may further have gate lines, source lines crossing the gate lines, switching elements electrically connected to the gate lines and the source lines, pixel electrodes connected to the gate lines and the source lines via the switching elements, and panel-side spare wiring electrically connected to the board-side spare wiring, and the panel-side spare wiring may cross the source lines via an insulating film near both ends of the source lines.

The display panel may be a liquid crystal panel.

The wiring board of the present invention has an insulating base, a signal wiring group running on the insulating base for transmitting signals, and at least one circuit element, wherein the signal wiring group is composed of element-connected wiring electrically connected to the circuit element and non-connected wiring having no electrical connection to the circuit element.

The wiring board may be placed along a periphery of a display panel, and the signals may be drive signals for driving the display panel.

Preferably, a plurality of signal lines constituting the signal wiring group run on the insulating base without crossing each other, the non-connected wiring is in a roughly U shape as viewed from top with both ends at the periphery of the insulating base, and at least one end of the element-connected wiring is located inside or outside both ends of the non-connected wiring at the periphery of the insulating base, or the element-connected wiring is interposed between a plurality of lines of the non-connected wiring.

Preferably, the non-connected wiring has another roughly U shape as viewed from top in at least a portion near one end extending in a direction away from the other end.

Alternatively, the wiring board of the present invention is the wiring board provided for the display device of the present invention. The display panel of the present invention is the display panel provided for the display device of the present invention.

BRIEF DESCRIPTION OF THE DRAWINGS

FIG. 16 is a schematic view illustrating an alteration to Embodiment 8.

DESCRIPTION OF THE PREFERRED EMBODIMENTS

Hereinafter, preferred embodiments of the present invention will be described with reference to the accompanying drawings. In the following embodiments, the present invention is applied to a liquid crystal display (LCD) device. However, the present invention can also be applied to a plasma display panel (PDP), organic and inorganic electroluminescence (EL) display devices, an electrochromic display device and the like. The LCD devices shown in the following embodiments can be any of a transmission type, a reflection type and a reflection/transmission type.

Figure 1:
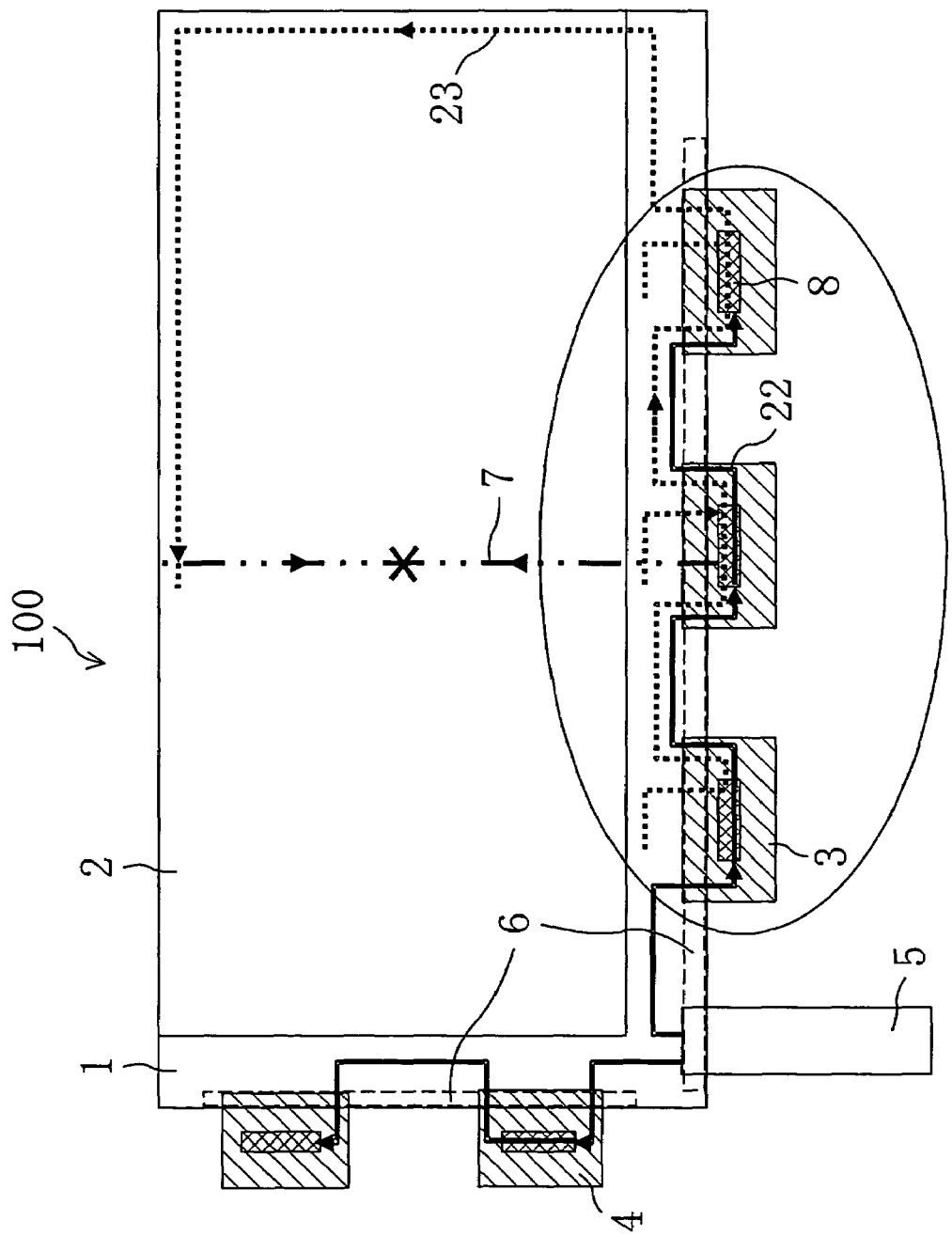
FIG. 1 is a diagrammatic plan view of the entire structure of an LCD device.

First, a rough entire structure of the LCD device will be described with reference to FIG. 1. FIG. 1 is a diagrammatic plan view of the entire structure of the LCD device. An area within the ellipse in FIG. 1 will be described in detail in Embodiments 1 to 8.

The LCD device includes a liquid crystal (LC) panel 100, and a plurality of source chips on film (COFs) 3, a plurality of gate COFs 4 and a signal input flexible printed circuit (FPC) 5 placed along the periphery 6 of the LC panel 100.

Although three source COFs 3, two gate COFs 4 and one signal input FPC 5 are shown in FIG. 1, the numbers of these components are not restrictive.

The LC panel 100 includes a thin film transistor (TFT) substrate 1, a color filter substrate 2 opposed to the TFT substrate 1, and a liquid crystal layer (not shown) interposed between the substrates 1 and 2. The thickness of the LC panel 100 is about 0.4 to 0.7 mm.

The TFT substrate 1 includes: a plurality of gate lines running in parallel with each other in a row direction; a plurality of source lines running in parallel with each other in a column direction respectively crossing the plurality of gate lines; TFTs arranged in a matrix to be electrically connected to the gate lines and the source lines; and pixel electrodes connected to the gate lines and the source lines via the TFTs. Terminals for connecting the source COFs 3, the gate COFs 4 and the signal input FPC 5 to one another are formed on the periphery 6 of the TFT substrate 1.

The color filter substrate 2 includes red, green and blue color filters and a common electrode covering the color filters. Rubbed alignment films are formed on the surfaces of the TFT substrate 1 and the color filter substrate 2 facing the liquid crystal layer.

Each of the source COFs 3 and the gate COFs 4 includes: a thin film base made of glass, polyimide resin or the like having a thickness of 25 to 40 μm; and a wiring pattern made of copper foil or the like having a thickness of 8 to 12 μm formed on the thin film base. The wiring pattern, composed of a plurality of wiring lines, is formed by plating or casting. A solder resist made of polyimide or the like having a thickness of 25 to 50 μm is formed over the wiring pattern excluding portions connected to the periphery 6 of the LC panel 100, to insulate the wiring pattern. An LC driving IC 8 is mounted on the center portion of each of the source COFs 3 and the gate COFs 4. Openings are formed through the solder resist at positions connected to terminals of the LC driving IC 8, to thereby permit electrical connection between some of the plurality of wiring lines constituting the wiring pattern and the terminals of the LC driving IC 8. Various components other than the LC driving IC 8 may also be mounted on the source COFs 3 and the gate COFs 4.

The source COFs 3, the gate COFs 4 and the signal input FPC 5 are connected to terminals formed on the periphery 6 of the LC panel 100 (hereinafter, such terminals are called LC panel terminals) via an anisotropic conductive film (ACF) by thermocompression bonding. The ACF is formed by dispersing thousands to tens of thousands of conductive particles, insulating particles and the like in an insulating adhesive. The ACF not only bonds terminals of the source COFs 3, the gate COFs 4 and the signal input FPC 5 to the LC panel terminals with the adhesive, but also electrically connects these terminals to each other via the conductive particles. The insulating particles in the ACF serve to prevent adjacent terminals from being short-circuited via linking conductive particles. The thickness of the ACF is desirably in the range of 10 to 50 μm. In particular, about 20 μm or less is preferred. The width of the ACF is preferably in the range of 1 to 3 mm.

As the conductive particles described above, usable are metal particles such as Ni particles, metal particles such as Ni particles plated with Au, carbon particles, plated thermoplastic resin particles such as thermoplastic resin particles (plastic particles) plated with Au or Ni/Au (Au plated after formation of a Ni layer on a base), transparent conductive particles such as indium tin oxide (ITO) particles, conductive particle composite plastic with metal particles such as Ni particles mixed in polyurethane, and the like.

Among others, plated thermoplastic resin particles are particularly preferred as the conductive particles. As the insulating particles described above, thermoplastic resin particles (plastic particles) are mainly used. The diameter of these conductive particles and insulating particles is preferably in the range of 2 to 12 μm. The plating thickness is preferably around 0.1 μm. Anisotropic conductive paste (ACP) may be used in place of the ACF. However, from the standpoint of easiness of handling, a film (ACF) is more desirable.

The connection using the ACF will be described. First, an unhardened ACF is stuck on the periphery 6 of the LC panel 100 so as to cover electrode terminals formed on the periphery 6. The source COFs 3, the gate COFs 4 and the signal input FPC 5 are then mounted on the periphery 6 of the LC panel 100 so that terminals of the source COFs 3, the gate COFs 4 and the signal input FPC 5 for connection to the electrode terminals of the LC panel 100 are placed above the electrode terminals of the LC panel 100. The ACF region (electrode terminal region) of the LC panel 100 is then compressed via the source COFs 3, the gate COFs 4 and the signal input FPC 5 with a heated bonding tool (not shown) at a pressure of 2 to 5 Mpa for 10 to 20 seconds, to harden the ACF and thus complete the connection. The heating temperature of the bonding tool is set at about 250 to 350° C. so that the final temperature of the ACF region during compression is 170 to 220° C. The width of the bonding tool as the compressing part is desirably about 1 to 3 mm, which is about the same as the width of the ACF. The connection on the source and gate sides is desirably performed at one time. Alternatively, the source COFs 3, the gate COFs 4 and the signal input FPC 5 may be connected one by one.

The transmission route of signals propagating on the LCD device will be described. The solid lines in FIG. 1 represent image signal wiring 22 for transmitting image signals such as RGB signals to the respective LC driving ICs 8, where the arrows indicate the transmitting direction. The image signals are supplied from the signal input FPC 5, and are transmitted via image signal wiring running on the periphery 6 of the LC panel 100 and image signal wiring running on the source COFs 3 and the gate COFs 4 to be input into the LC driving ICs 8 mounted on the COFs 3 and 4. In FIG. 1, only one image signal wiring line 22 is shown for simplification, and it appears as if image signals to be input into the respective COFs 3 and 4 are transmitted together through one signal line. Actually, however, image signals to be input into the respective COFs 3 and 4 are transmitted via separate lines, as will be described later.

The dotted lines in FIG. 1 represent spare wiring 23 for transmitting spare signals to the opposite side of the LC panel 100, where the arrows indicate the transmitting direction. The spare wiring 23 is wiring used in such an event that transmission of an image signal output from a certain source COF 3 to an image signal output wiring line 7 indicated by the two-dot chain line is impeded by disconnection of the wiring line 7 at a position marked X in FIG. 1 caused by some reason. Although only one image signal output wiring line 7 is shown in FIG. 1, a number of such wiring lines actually extend across the LC panel 100 to the opposite side to lead image signals output from the LC driving ICs 8 of the source COFs 3 to the TFTs of the LC panel 100.

One or two spare wiring lines run near both ends of each source COF 3 on the periphery of the LC panel 100 so as to cross the image signal output wiring 7 with an insulating film interposed therebetween. The spare wiring is routed along the periphery of the LC panel 100.

Once transmission of an image signal is impeded at the position marked X mentioned above, the portions of the insulating film at the crossing points between the disconnected image signal output wiring line 7 and the spare wiring 23 (two points on the side of the source COF 3 and the opposite side) are broken by irradiating the portions with laser light, to thereby establish another route of supplying the image signal from the opposite side. With this new route, the image signal can be brought to the position marked X from the opposite side, and thus can repair the fault of the panel. In other words, the image signal output wiring line 7 is connected to the spare wiring 23 at both ends thereof, forming another route of supplying the image signal from the opposite side, in addition to the route of supplying the image signal from the side of the source COF 3. The signal propagating through the spare wiring 23 at this occasion is herein called a spare signal. Wiring other than the spare wiring 23, such as power supply wiring, is also provided. However, description of such wiring having no direct relation with the present invention is omitted here.

Embodiment 1

Figure 2:
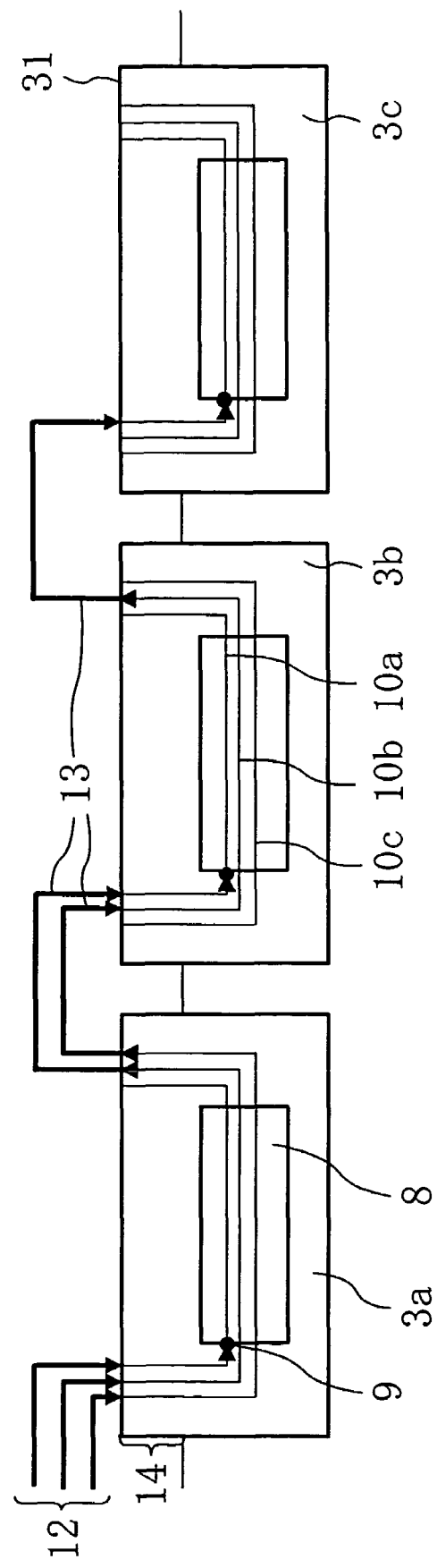
FIG. 2 is a schematic view illustrating a wiring structure in Embodiment 1.

FIG. 2 is a schematic view illustrating the wiring structure in Embodiment 1, which covers the area within the ellipse in FIG. 1. The LC driving ICs 8 of the source COFs 3 are shown as being transparent for clarification of the wiring. Note that for simplification of description, only wiring for transmitting image signals is shown, and illustration of other wiring such as common signal wiring (hereinafter, called COM wiring), power supply/ground (GND) wiring, output wiring from the LC driving ICs and spare wiring is omitted. Note also that to collectively represent components of the same kind, only numerical part of each reference code is occasionally expressed omitting alphabetical part thereof. For example, source COFs 3a, 3b and 3c are collectively expressed as the source COFs 3 in some cases.

FIG. 2 shows the source COFs 3, the LC driving ICs 8 mounted on the source COFs 3, transmission wiring 12 for transmitting image signals supplied from the signal input FPC 5 (see FIG. 1) to the COFs 3, panel-side transmission wiring 13 for transmitting the image signals between the adjacent source COFs 3, and a COF-side wiring group 10 on each COF for supplying some of the image signals to the LC driving IC 8 and passing the remaining image signals to the adjacent source COF 3. Image signals are input into the LC driving IC 8 at an image signal input point 9. The transmission wiring 12 and the panel-side transmission wiring 13 are connected to the COF-side wiring groups 10 via the ACF in a connection region 14. For easy understanding, the panel-side transmission wiring 13 is shown by the bold lines, while the COF-side wiring groups 10 are shown by the fine lines.

The wiring structure of the source COFs 3 will be described. To transmit image signals for the respective source COFs 3a, 3b and 3c via separate wiring lines, to be input into their LC driving ICs 8, it is necessary to form wiring lines of the number corresponding to the number of LC driving ICs 8 of the source COFs 3 to which the image signals are transmitted. As four image signals are generally input into each LC driving IC 8, four image signal lines are required for each LC driving IC 8. Note that in FIG. 2, the four image signal lines are collectively shown by one line as one set. In the illustrated example, in which image signals are transmitted to the three source COFs 3a, 3b and 3c, three sets of wiring lines are necessary for each COF. The three sets of wiring lines run on an insulating base of each COF in a rough U shape as viewed from above without crossing one another. Both ends of the wiring lines of each COF are located at a periphery 31 of the insulating base for connection with the panel-side transmission wiring 12 and 13 via the ACF. Hereinafter, the three sets of wiring lines located inside, in the middle and outside are respectively referred to as inner (upper) wiring 10a, middle wiring 10b and outer (lower) wiring 10c.

One of the three sets of wiring 10a, 10b and 10c must be connected to the LC driving IC 8 of each source COF. Therefore, arrangement is made to connect only one set of wiring (one line) to the LC driving IC 8. In the source COF 3a on the left as viewed from FIG. 2, the inner wiring 10a is electrically connected to the LC driving IC 8 at the image signal input point 9. Such wiring electrically connected to the LC driving IC 8 is herein called element-connected wiring. The other two sets of wiring 10b and 10c are not electrically connected to the LC driving IC 8 of the source COF 3a, but transmit image signals supplied from the transmission wiring 12 to the adjacent source COF 3b. Such sets of wiring 10b and 10c are herein called non-connected wiring. Note that the arrows in FIG. 2 represent the directions in which the image signals propagate. The wiring having no arrow do not transmit image signals.

The wiring structure of the LC panel will be described. In each of the source COFs 3a, 3b and 3c, the wiring 10a, which supplies image signals to the LC driving IC 8, run inside (upper side). The upper, middle and lower sets of the transmission wiring 12 supply image signals to be input into the left COF 3a, the middle COF 3b and the right COF 3c, and are connected to the inner (upper) wiring 10a, the middle wiring 10b and the outer (lower) wiring 10c, respectively. Image signals supplied from the upper transmission wiring 12 are input into the LC driving IC 8 of the left COF 3a. Image signals supplied from the middle and lower transmission wiring 12 are passed to the panel-side transmission wiring 13 without being input into the LC driving IC 8 of the left COF 3a.

The panel-side transmission wiring 13 for connecting the left COF 3a and the middle COF 3b, which is composed of two sets of wiring lines formed not to cross each other, is routed so that the middle wiring 10b and the lower wiring 10c of the COF 3a are respectively connected to the upper wiring 10a and the middle wiring 10b of the COF 3b. Image signals supplied from the upper transmission wiring 13 are input into the LC driving IC 8 of the middle COF 3b. Image signals supplied from the lower transmission wiring 13 are passed to the next panel-side transmission wiring 13 without being input into the LC driving IC 8 of the middle COF 3b.

The panel-side transmission wiring 13 for connecting the middle COF 3b and the right COF 3c, which is composed of one set of wiring lines, is routed so that the middle wiring 10b of the COF 3b is electrically connected to the upper wiring 10a of the COF 3c. Image signals supplied from the transmission wiring 13 are input into the LC driving IC 8 of the right COF 3c. The lower wiring 10c of the middle COF 3b and the middle wiring 10b and the lower wiring 10c of the right COF 3c are not connected to the transmission wiring 13.

As described above, in this embodiment, the panel-side transmission wiring 13 is routed so that the connection between the wiring lines of the adjacent source COFs is displaced inward by one set of wiring (by one line). To state specifically, the middle wiring 10b of the COFs 3a and 3b is respectively connected to the upper wiring 1a of the adjacent COFs 3b and 3c displaced inward (rightward) by one set of wiring. Also, the lower wiring 10c of the COF 3a is connected to the middle wiring 10b of the adjacent COF 3b displaced inward (rightward) by one set of wiring. With this arrangement, COFs having the same wiring pattern can be used even in the case of supply of individual image signals to the individual COFs. If the panel-side transmission wiring 13 connects the wiring lines of the adjacent source COFs without the displacement, it is necessary to provide a plurality of COFs having LC driving ICs different in input point. That is, in this embodiment, COFs having the same wiring structure can be used for transfer of image signals to the LC driving ICs of the respective COFs via separate wiring lines.

In this embodiment, the wiring 10a (element-connected wiring) electrically connected to the LC driving IC 8 is formed inside the wiring 1ob and 10c (non-connected wiring) having no electrical connection with the LC driving LC 8. Therefore, in the connection between the left COF 3a and the middle COF 3b so that the wiring lines are displaced inward by one set of wiring (by one line), the two sets of transmission wiring 13 are prevented from crossing each other. This can simplify the structure of the transmission wiring 13, compared with connection involving crossing of the sets of transmission wiring 13.

The portion of the upper wiring line 10a downstream the input point 9 (right portion with respect to the input point 9 as viewed from FIG. 2), which is not used, may be omitted. The lower wiring 10c of one source COF 3 may be connected to the lower wiring 10c of the adjacent COF 3. For example, in place of connecting the lower wiring 10c of the left COF 3a to the middle wiring 1ob of the middle COF 3b in displacement, the lower wiring 10c of the left COF 3a may be connected to the lower wiring 10c of the middle COF 3b without displacement. In this case, the connection between the wiring lines of the middle COF 3b and the right COF 3c is displaced inward by two sets of wiring (by two lines) via the transmission wiring 13 so that the lower wiring 10c of the middle COF 3b is connected to the upper wiring 10a of the right COF 3c.

In this embodiment, the signal input FPC 5 is placed on the left of the LC panel 100, and image signals are supplied from the left. In the case of placing the signal input FPC 5 on the right of the LC panel 100 and supplying image signals from the right, also, the same COFs as those used for the supply of image signals from the left can be used only by changing the way of displacement of the connection between the wiring lines via the panel-side transmission wiring 13.

In this embodiment, image signals can be input into the LC driving ICs 8 of the respective COFs via separate wiring lines. Therefore, increase of the clock frequency of image signals input into the LC driving ICs 8, which occurs in the wiring structure of the conventional signal propagation mode, can be suppressed.

Embodiment 2

Figure 3:
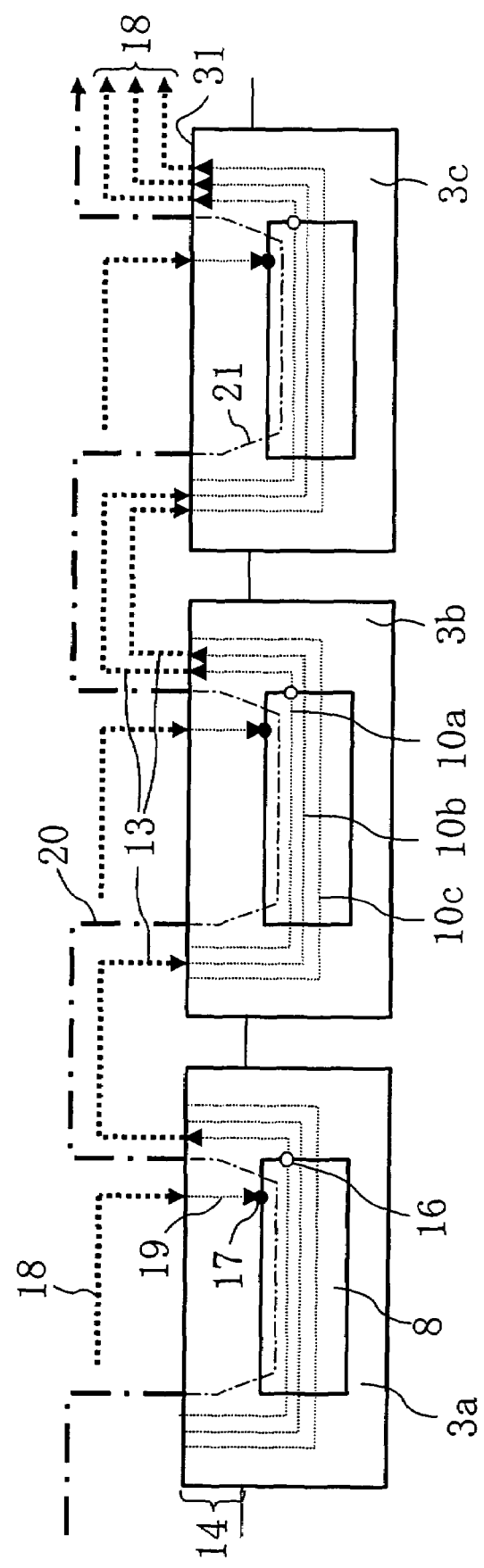
FIG. 3 is a schematic view illustrating a wiring structure in Embodiment 2.

FIG. 3 is a schematic view illustrating the wiring structure in Embodiment 2, which covers the area within the ellipse in FIG. 1. Note that the LC driving ICs 8 of the source COFs 3 are shown as being transparent for clarification of the wiring. Note also that for simplification of description, only wiring for transmitting a spare signal and COM wiring are shown in FIG. 3, omitting illustration of other wiring such as power supply/ground (GND) wiring, output wiring from the LC driving ICs and image signal wiring. In FIG. 3 and the subsequent figures, components of the wiring structure having substantially the same functions as those in Embodiment 1 are denoted by the same reference numerals, and the description thereof is omitted.

The structure in FIG. 3 includes the source COFs 3, the LC driving ICs 8 mounted on the source COFs 3, the panel-side transmission wiring 13 for transmitting a spare signal between the adjacent source COFs 3, the COF-side wiring group 10 on each source COF 3 for transmitting a spare signal to the adjacent source COF 3, a spare signal output point 16 at which a spare signal is output from the LC driving IC 8, a spare signal input point 17 at which a spare signals is input into the LC driving IC 8, panel-side spare wiring 18 for collecting a spare signal and transmitting the spare signal to the opposite side of the LC panel, COF-side spare wiring 19 for connecting the panel-side spare wiring 18 and the input point 17, panel-side COM wiring 20 and COF-side COM wiring 21. The panel-side spare wiring 18 is routed from the right of the right source COF 3c up to the opposite side of the LC panel.

The source COFs 3 are connected to the LC panel 100 via the ACF in the connection region 14, to thereby establish connection between the panel-side transmission wiring 13 and the COF-side wiring groups 10, connection between the panel-side spare wiring 18 and the COF-side spare wiring 19, and connection between the panel-side COM wiring 20 and the COF-side COM wiring 21. A spare signal input into the LC driving ICs 8 at the spare signal input point 17 is output at the spare signal output point 16 via a buffer of the LC driving IC 8. In FIG. 3, for easy understanding, the panel-side transmission wiring 13 is shown by the bold dotted lines, while the COF-side wiring groups are shown by the fine dotted lines. As for the COM wiring, the panel-side COM wiring is shown by the bold one-dot chain lines, while the COF-side COM wiring is shown by the fine one-dot chain lines. In FIG. 3, for simplification, normally two (or one in not a few cases) spare wiring lines for each COF are shown by one line as one set. The arrows in FIG. 3 represent the directions in which a signal propagates. The wiring having no arrow do not transmit the signal.

The wiring structure of the source COFs 3 will be described. In this embodiment, in which three source COFs are provided, supply of three sets of spare signals is required for one COF. Three sets of wiring lines run on an insulating base of each COF in a rough U shape as viewed from above without crossing one another. Both ends of these wiring lines on each COF are located at the periphery 31 of the insulating base for connection with the panel-side transfer wiring 13 via the ACF. Hereinafter, the three sets of wiring lines located inside, in the middle and outside are respectively referred to as inner (upper) wiring 10a, middle wiring 10b and outer (lower) wiring 10c. The spare signal output point 16 is provided for one of these sets of wiring for collecting a spare signal coming from the panel via the buffer of the LC driving IC 8. In this embodiment, the output point 16 is provided for the inner wiring 10a. The reason why the spare signal is collected via the buffer of the LC driving IC 8 is to eliminate the necessity of overstriding the COF-side COM line 21, which is routed between the COF-side spare wiring 19 and the inner wiring 10a, by means of a jumper chip or the like.

The wiring structure of the LC panel will be described. A spare signal is transmitted from left to right as viewed from FIG. 3. Therefore, in the connection between the adjacent COFs via the panel-side transfer line 13, the positions of the sets of wiring connected are displaced outward (leftward) by one set between the adjacent COFs so that the inner wiring 10a of the left COF 3a permitting output of a spare signal is connected to the middle wiring 10b of the middle COF 3b having no spare signal output point. Further, to connect the middle wiring 10b of the middle COF 3b permitting propagation of the spare signal to the outer wiring 10c of the right COF 3c, the panel-side transmission wiring 13 is routed so that the positions of the sets of wiring connected are displaced outward (leftward) by one set between the adjacent COFs. In this way, spare signals at the respective COFs 3a, 3b and 3c are transmitted to the panel-side spare wiring 18 connected to the right COF 3c on the right.

As described above, in this embodiment, the panel-side transmission wiring 13 is routed so that the positions of the sets of wiring connected are displaced outward by one set between the adjacent source COFs. With this arrangement, COFs having the same wiring pattern can be used as the adjacent source COFs connected to each other. If the panel-side transmission wiring 13 connects the sets of wiring of the adjacent source COFs without the displacement, that is, if the wiring counterparts of the adjacent COFs are connected to each other, it will be necessary to provide a plurality of types of COFs different in spare signal output point. That is to say, in this embodiment, COFs having the same wiring structure can be used for transfer of spare signals from the LC driving ICs of the respective COFs via separate wiring lines.

The left portion of the inner wiring 10a with respect to the spare signal output point 16 as viewed from FIG. 3, which is not used, may be omitted. In this embodiment, the panel-side transmission wiring 13 is routed so that the positions of the sets of wiring connected are displaced by one set between the adjacent COFs. Alternatively, the inner wiring 10a of the left COF 3a may be connected to the outer wiring 10c of the middle COF 3b by displacement by two sets. In this case, the inner wiring 10a of the middle COF 3b is connected to the middle wiring 10b of the right COF 3c by displacement by one set, while the outer wiring 10c of the middle COF 3b is connected to the outer wiring 10c of the right COF 3c without displacement.

In this embodiment, the spare signals were transmitted from left to right of the LC panel 100. In the case of transmitting the spare signals from right to left, also, the same COFs as those used for the transmission from left to right can be used only by changing the way of displacement with the panel-side transmission wiring 13.

Embodiment 3

Figure 4:
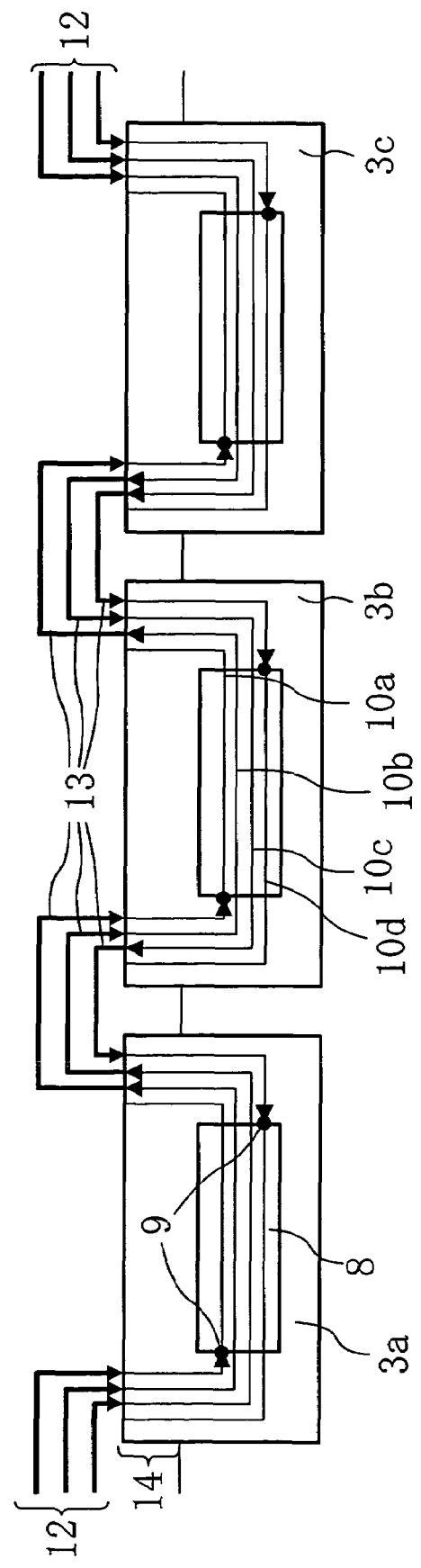
FIG. 4 is a schematic view illustrating a wiring structure in Embodiment 3.

FIG. 4 is a schematic view illustrating the wiring structure in Embodiment 3, which covers the area within the ellipse in FIG. 1. This embodiment is an application of Embodiment 1. In Embodiment 1, the signal input FPC 5 is located either on the left or right side, to allow supply of image signals from only one side. In this embodiment, the signal input FPC 5 is located on each of the left and right sides, to allow supply of image signals in two parts from the left and right sides for one COF.

The source COF 3 in this embodiment is different from the source COF 3 in Embodiment 1 in that an additional set of wiring 10d having the image signal input point 9 is formed outside the wiring 10c. In addition, the LC panel 100 in this embodiment has transmission wiring 12 extending from the right-side signal input FPC (not shown). The number of wiring lines for each set is two in this case because the normally four image signals are divided into two.

The wiring structure of each source COF 3 will be described. In this embodiment, the COF-side wiring unused in Embodiment 1 is effectively used. First, the three sets of wiring 10a, 10b and 10c are routed as in Embodiment 1 on the source COFs 3a, 3b and 3c. In addition, another set of wiring 10d having the image signal input point 9 is routed outside the wiring 10c. Note that one set is composed of two wiring lines in this embodiment.

The connection between the transmission wiring 12 extending from the right-side signal input FPC and the right source COF 3c is made so that image signals for the right COF, the middle COF and the left COF are supplied to the sets of wiring 10d, 10c and 10b of the right COF 3c, respectively. Using the wiring 10d, as well as the sets of wiring 10a, 10b and 10c, the panel-side transmission wiring 13 is routed to connect the sets of wiring of the adjacent COFs in displacement as described in Embodiment 1. In this embodiment, in which the wiring 10d having the image signal input point 9 runs outermost, the panel-side transmission wiring 13 is routed so that the positions of the sets of wiring connected are displaced outward by one set between the adjacent COFs.

Specifically, the panel-side transmission wiring 13 for connecting the right COF 3c and the middle COF 3b is routed so that the wiring 10b of the COF 3c is electrically connected to the wiring 10c of the COF 3b and the wiring 10c of the COF 3c is electrically connected to the wiring 10d of the COF 3b. Likewise, the panel-side transmission wiring 13 for connecting the middle COF 3b and the left COF 3a is routed so that the wiring 10c of the COF 3b is electrically connected to the wiring 10d of the COF 3a.

With the wiring structure described above, image signals can be supplied in two parts from the left and right sides simultaneously. In addition, since effective use of the three sets of wiring 10a, 10b and 10c is possible unlike Embodiment 1, the number of wiring lines for each COF can be reduced. Specifically, a total of 12 wiring lines (6 sets×2 lines) will be necessary for each COF to transmit image signals to be input into the respective COFs via separate wiring lines. In this embodiment, however, only 8 wiring lines (4 sets×2 lines) are enough.

Embodiment 4

Figure 5:
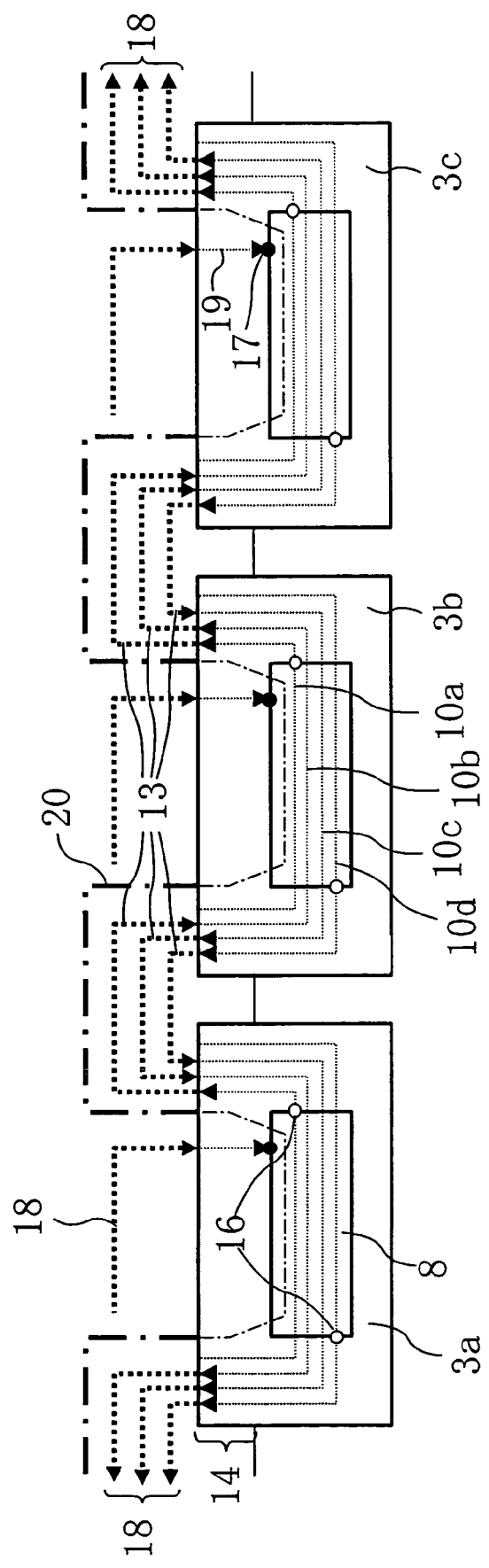
FIG. 5 is a schematic view illustrating a wiring structure in Embodiment 4.

FIG. 5 is a schematic view illustrating the wiring structure in Embodiment 4, which covers the area within the ellipse in FIG. 1. This embodiment is an application of Embodiment 2. In Embodiment 2, spare signals are transmitted either leftward or rightward. In this embodiment, spare signals are transmitted in two parts both leftward and rightward.

The source COF 3 in this embodiment is different from the source COF 3 in Embodiment 2 in that an additional set of wiring 10d having the spare signal output point 16 is formed outside the wiring 10c, to thereby enable transmission of a spare signal from right to left in addition to the transmission in the opposite direction. The number of wiring lines for each set is one in this case because normally two spare signals are divided into two.

The wiring structure of each source COF 3 will be described. In this embodiment, the wiring unused in Embodiment 2 is effectively used. First, three sets of wiring 10a, 10b and 10c are routed as in Embodiment 2 on the source COFs 3a, 3b and 3c. In addition, another set of wiring 10d having the spare signal output point 16 is routed outside the wiring 10c. Note that one set is composed of one wiring line in this embodiment. In this embodiment, there are provided two spare signal output points 16 for collecting a spare signal coming from the panel via the buffer of the LC driving IC 8. This enables transmission of the spare signal in both left and right directions.

The connection between the spare wiring 18 and the transmission wiring 13 on the panel and the source COFs 3a, 3b and 3c is as described in Embodiment 2. In this embodiment, in which the wiring 10d having the spare signal output point 16 is located outermost, the panel-side transmission wiring 13 is routed so that the positions of the sets of wiring connected are displaced inward by one set between the adjacent COFs. Specifically, the panel-side transmission wiring 13 for connecting the right COF 3c and the middle COF 3b is routed so that the wiring 10d of the COF 3c is electrically connected to the wiring 10c of the COF 3b. Likewise, the panel-side transmission wiring 13 for connecting the middle COF 3b and the left COF 3a is routed so that the wiring 10c and the wiring 10d of the COF 3b are electrically connected to the wiring 10b and the wiring 10c of the COF 3a, respectively.

With the wiring structure described above, a spare signal can be supplied in two parts to both the left and right ends. In addition, since effective use of the three sets of wiring 10a, 10b and 10c is possible unlike Embodiment 2, the number of wiring lines for each COF can be reduced. Specifically, although a total of 6 wiring lines are generally necessary, only 4 wiring lines are enough in this embodiment.

Embodiment 5

Figure 6:
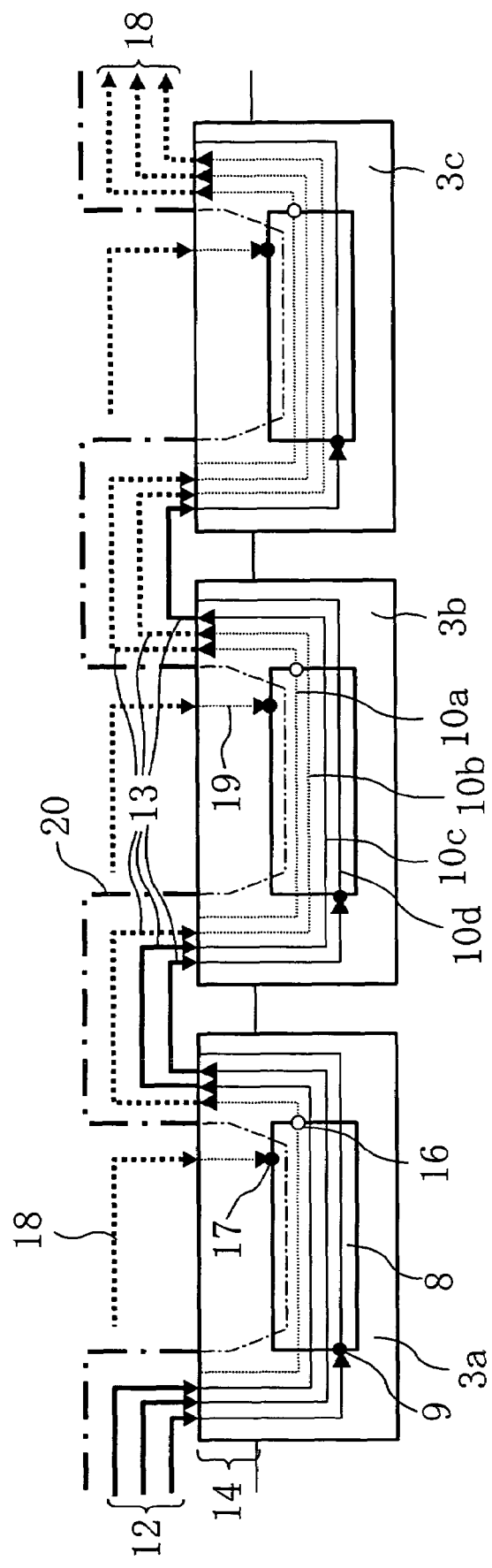
FIG. 6 is a schematic view illustrating a wiring structure in Embodiment 5.
Figure 7:
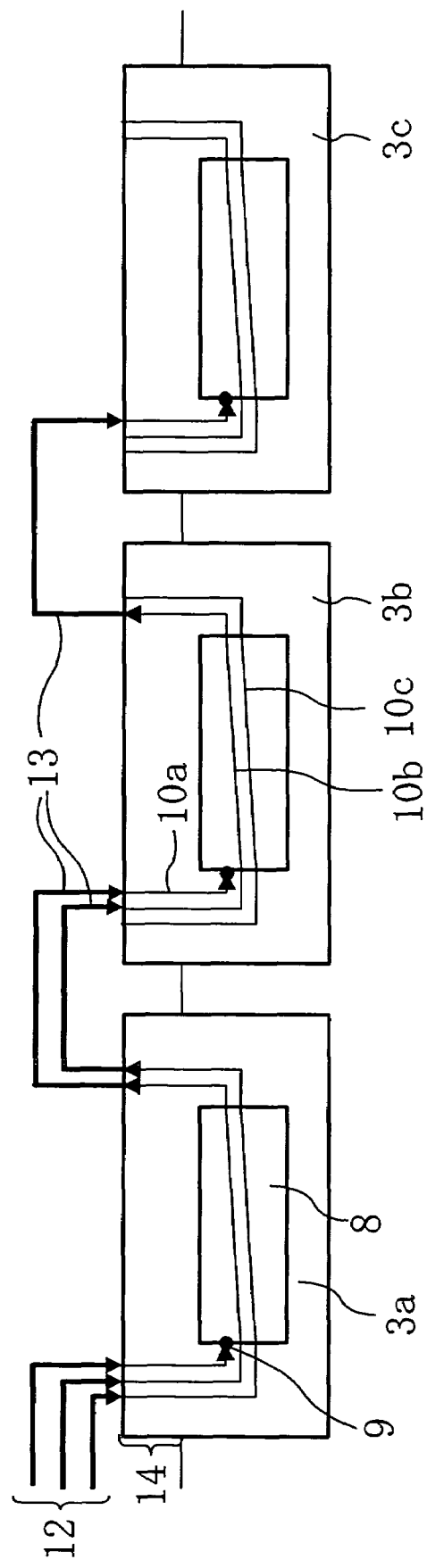
FIG. 7 is a schematic view illustrating an alteration to Embodiment 1.
Figure 8:
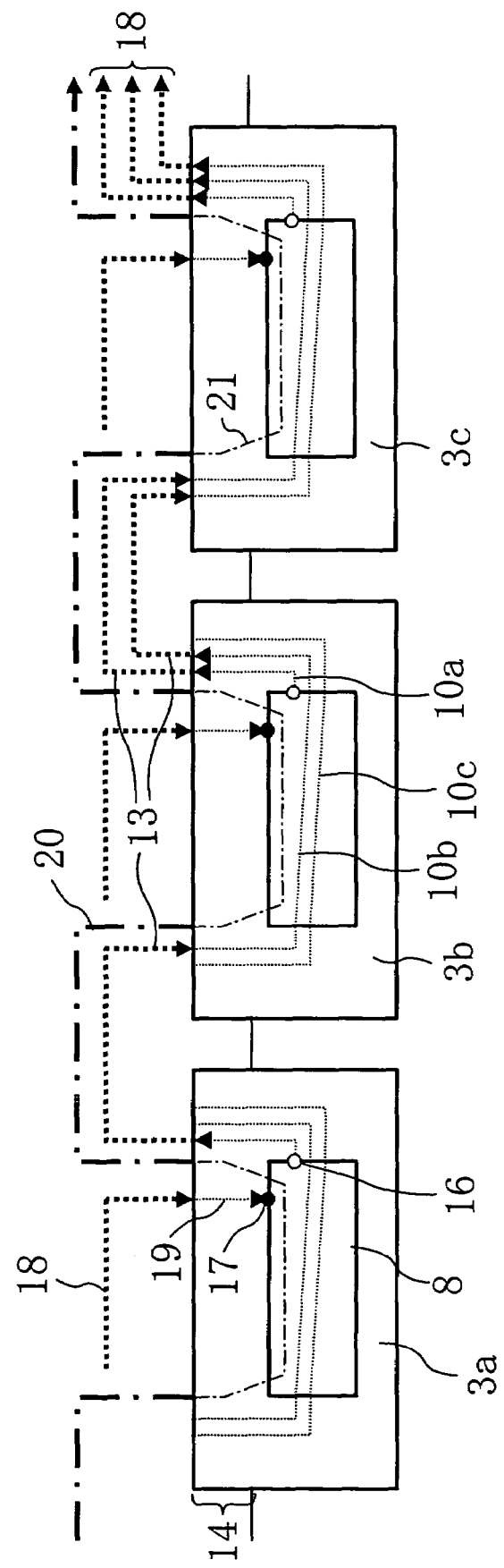
FIG. 8 is a schematic view illustrating an alteration to Embodiment 2.
Figure 9:
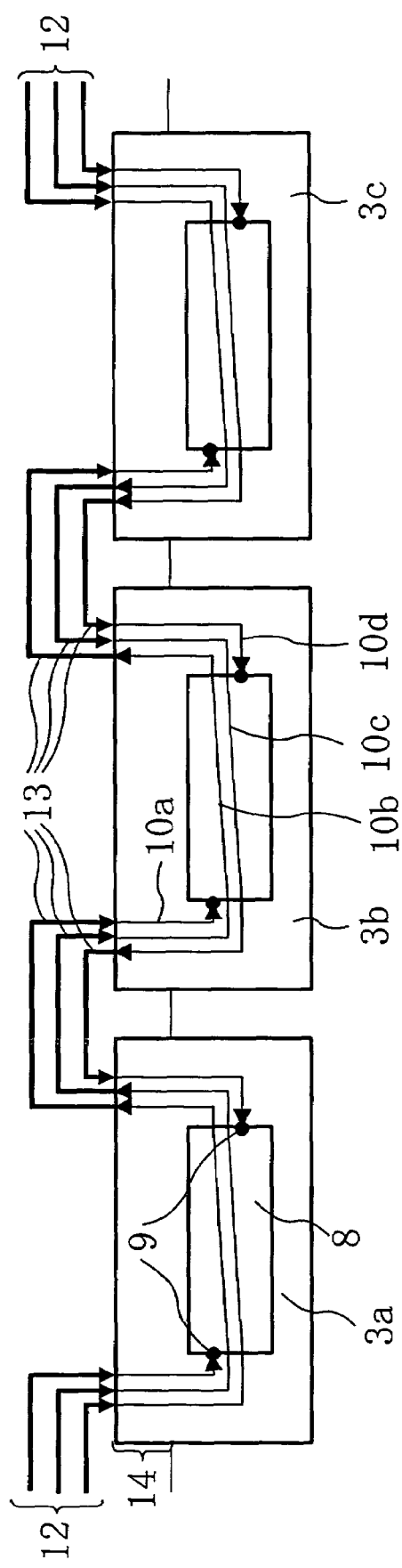
FIG. 9 is a schematic view illustrating an alteration to Embodiment 3.
Figure 10:
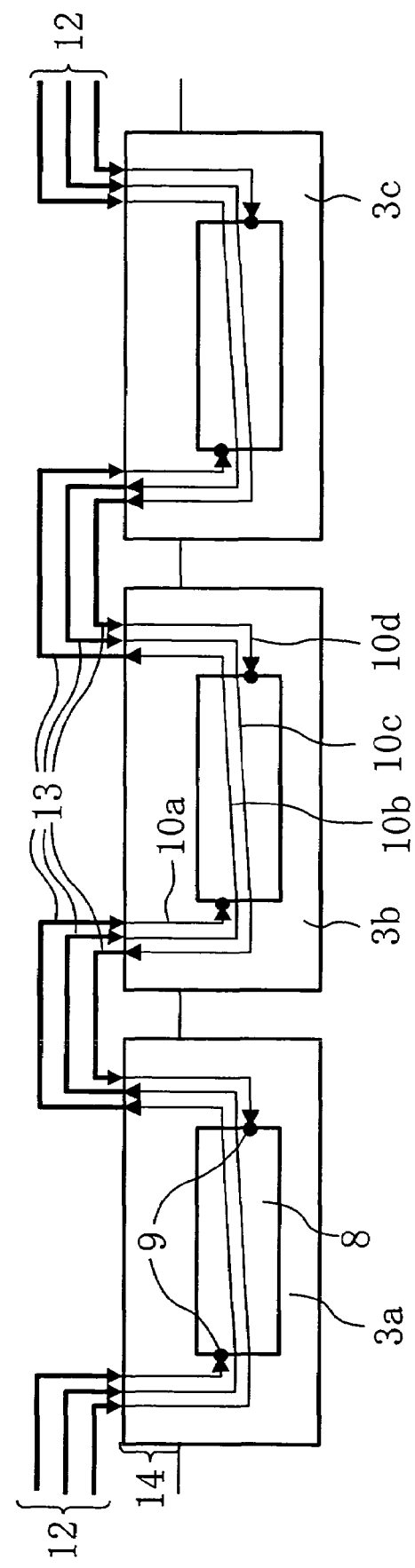
FIG. 10 is a schematic view illustrating an alteration to Embodiment 4.
Figure 11:
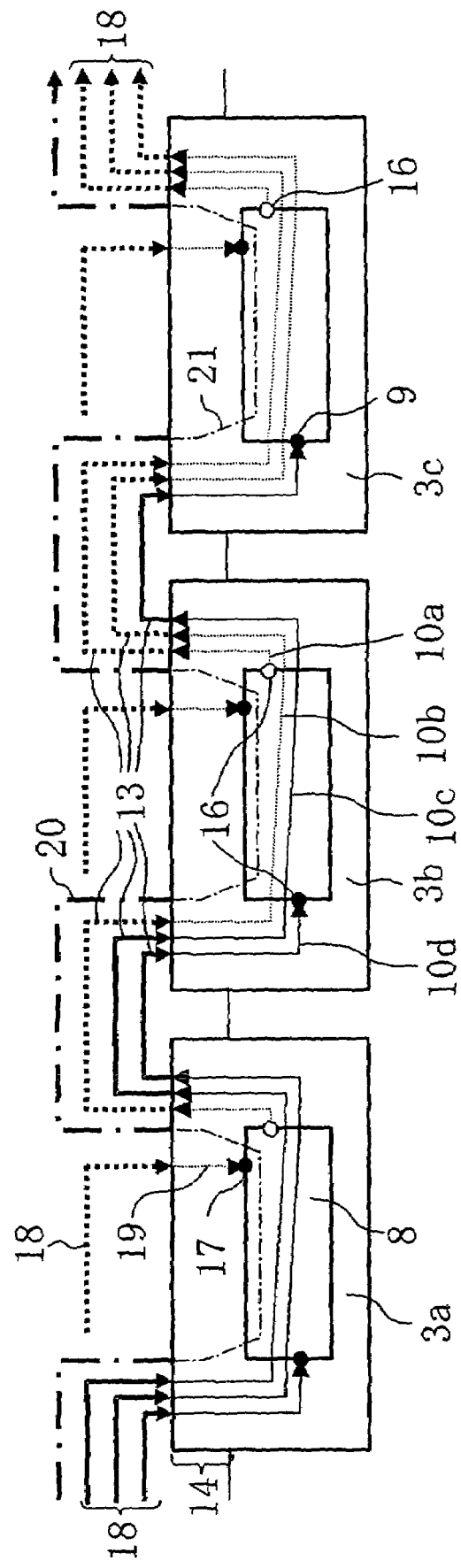
FIG. 11 is a schematic view illustrating an alteration to Embodiment 5.

FIG. 6 is a schematic view illustrating the wiring structure in Embodiment 5, which covers the area within the ellipse in FIG. 1. The wiring structures were described separately for image signals in Embodiment 1 and for spare signals in Embodiment 2. In this embodiment, a wiring structure combining these two wiring structures will be described.

The source COF 3 in this embodiment is different from the source COF 3 in Embodiment 2 in that an additional set of wiring 10d having the image signal input point 9 is formed outside the wiring 10c, to thereby enable transmission of image signals from left to right as in Embodiment 1 and transmission of spare signals from left to right as in Embodiment 2.

The wiring structure of each source COF 3 will be described. In this embodiment, the wiring lines unused in Embodiment 2 are effectively used. First, three sets of wiring 10a, 10b and 10c are routed as in Embodiment 2 on the source COFs 3a, 3b and 3c. In addition, another set of wiring 10d having the image signal input point 9 is routed outside the wiring 10c. In this embodiment, one set is composed of two wiring lines for the wiring 10a, while it is composed of four wiring lines for the remaining sets of wiring 10b, 10c and 10d.

The connection between the spare wiring 18 and the transmission wiring 13 on the panel and the source COFs 3a, 3b and 3c is substantially the same as that in Embodiment 2. However, with the wiring 10d having the image signal input point 9 located outermost, the displacement of the connection between the sets of wiring of the adjacent COFs is opposite to the case of Embodiment 1 in which the wiring having the image signal input point 9 is located innermost. Specifically, the panel-side transmission wiring 13 for connecting the left COF 3a and the middle COF 3b is routed so that the wiring 10b and the wiring 10c of the COF 3a are electrically connected to the wiring 10c and the wiring 10d of the COF 3b. Also, the panel-side transmission wiring 13 for connecting the middle COF 3b and the right COF 3c is routed so that the wiring 10c of the COF 3b is electrically connected to the wiring 10d of the COF 3c.

In this embodiment, COFs having the same wiring structure can be used for transfer of image signals into and transfer of spare signals from the LC driving ICs of the respective COFs via separate lines. With the wiring structure in this embodiment, the number of COF-side wiring lines can be reduced from the number obtained by simply adding the numbers of COF-side wiring lines in Embodiments 1 and 2. Specifically, the simply added number of wiring lines is 18, where the number of wiring lines in Embodiment 1 is 12 (3 sets×4 lines) and that in Embodiment 2 is 6 (3 sets×2 lines). In this embodiment, the number can be reduced to 14 (1 set×2 lines+3 sets×4 lines).

Embodiment 6

A plurality of embodiments are conceivable by combining and applying Embodiments 1 to 5. Some of such embodiments will be described with reference to FIGS. 7 to 11. FIGS. 7 to 11 show alterations to Embodiments 1 to 5 and correspond to FIGS. 2 to 6, respectively.

Each source COF 3 described in Embodiments 1 to 5 has an unused wiring portion, which is specifically a wiring portion left after the input of an image signal at the image signal input point 9 or a wiring portion existing before the output of a spare signal at the spare signal output point 16. In FIGS. 7 to 11, such unnecessary wiring portions are eliminated from the wiring structures in Embodiments 1 to 5.

As shown in FIGS. 7 to 11, with the elimination of the unnecessary wiring portions, the sets of wiring 10b and 10c are displaced toward the eliminated wiring by one set on the COF. For example, in each source COF 3 shown in FIG. 7, while the wiring 10b is the second from the innermost on the left with respect to the LC driving IC 8, it is displaced inward by one set to the innermost on the right. By adopting the wiring structures shown in FIGS. 7 to 11, the number of COF-side wiring lines can be reduced.

Embodiment 7

In Embodiments 1 to 6, one LC driving IC 8 is mounted on one COF. The present invention is also applicable to a multi-chip type COF on which a plurality of LC driving ICs are mounted.

Figure 12:
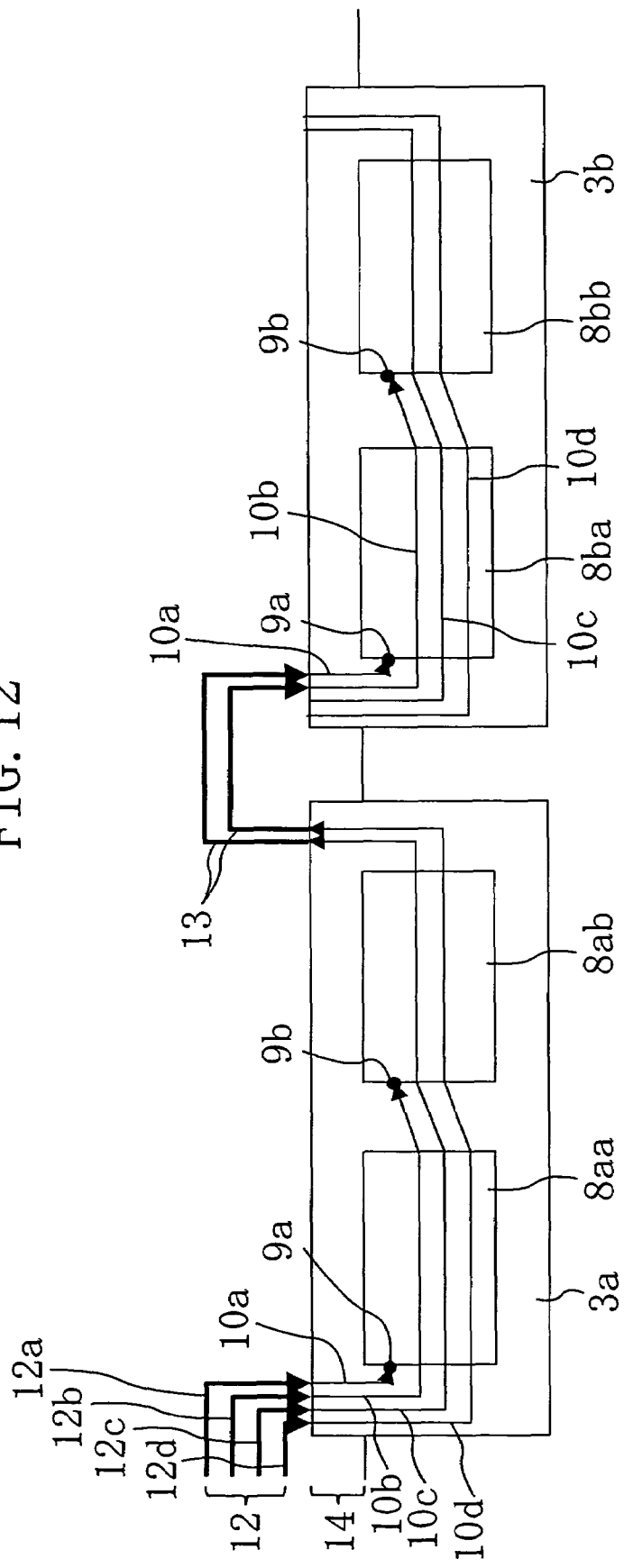
FIG. 12 is a schematic view diagrammatically illustrating multi-chip type COFs in which two LC driving ICs are mounted on a COF that is similar to that shown in FIG. 7.
Figure 13:
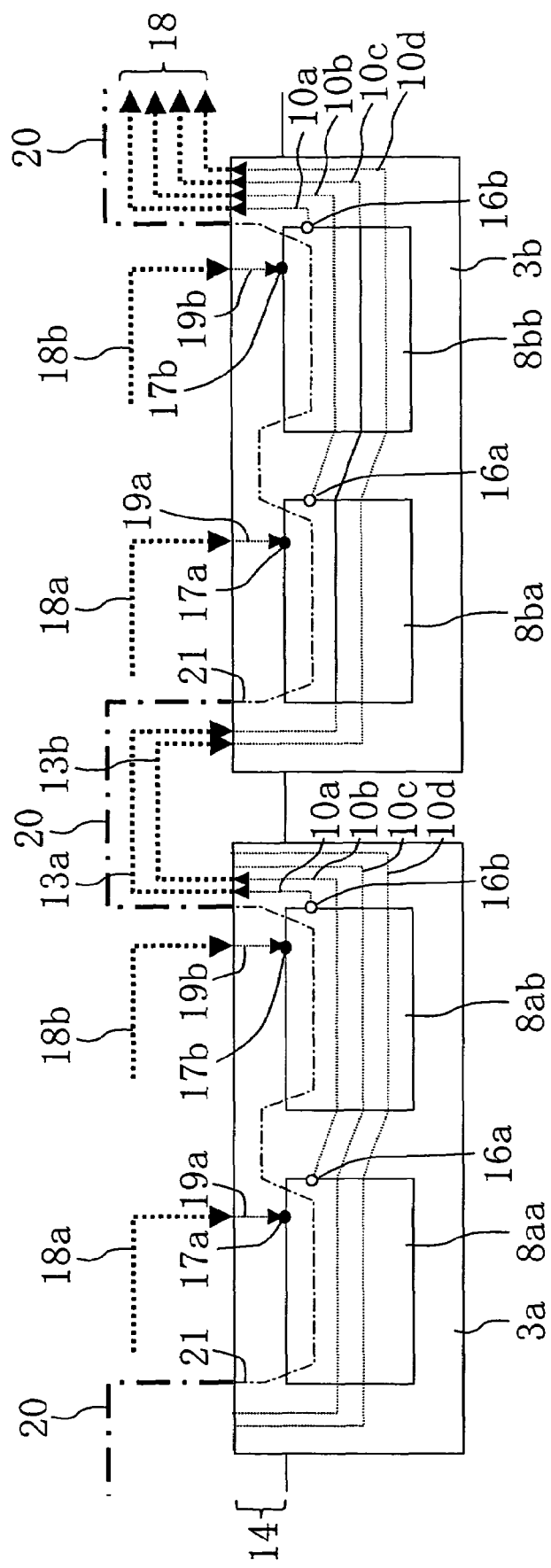
FIG. 13 is a schematic view diagrammatically illustrating multi-chip type COFs in which two LC driving ICs are mounted on a COF that is similar to that shown in FIG. 8.

FIGS. 12 and 13 are schematic views diagrammatically illustrating multi-chip type COFs having two LC driving ICs mounted on one COF. The wiring structures shown in FIGS. 12 and 13 are applications of the wiring structures shown in FIGS. 7 and 8, respectively.

Each of the left and right COFs 3a and 3b shown in FIG. 12 includes two LC driving ICs 5aa and 8ab (5ba and 8bb) mounted on an insulating thin film base and four sets of wiring 10a, 10b, 10c and 10d. The first wiring 10a, which is the innermost one among the four sets of wiring 10a to 10d, is electrically connected to the left LC driving IC 8aa (8ba) at an image signal input point 9a. The second wiring 10b, which is the second innermost one, extends under the left LC driving IC 8aa (8ba) and is electrically connected to the right LC driving IC 8ab (8bb) at an image signal input point 9b. The remaining third and fourth wiring 10c and 10d extend in a roughly U shape as viewed from top with both ends at the periphery of the insulating base. That is to say, two sets of wiring 10a and 10b among the four sets of wiring 10a, 10b, 10c and 10d are element-connected wiring, while the remaining sets of wiring 10c and 10d are non-connected wiring.

The wiring structure on the panel will be described. Four sets of transmission wiring 12a, 12b, 12c and 12d are connected to the first wiring 10a, the second wiring 10b, the third wiring 10c and the fourth wiring 10d, respectively, for transmission of image signals to be input into the left and right LC driving ICs 8aa and 8ab of the left COF 3a and the left and right LC driving ICs 8ba and 8bb of the right COF 3b, respectively. The image signal supplied from the first transmission wiring 12a is input into the left LC driving IC 8aa, and the image signal supplied from the second transmission wiring 12b is input into the right LC driving IC 8ab. The image signals supplied from the other sets of transmission wiring 12c and 12d are not input into the LC driving ICs of the left COF 3a but are passed to the panel-side transmission wiring 13.

The panel-side transmission wiring 13 for connecting the left COF 3a and the right COF 3b is routed so that the third wiring 10c and the fourth wiring 10d of the left COF 3a are electrically connected to the first wiring 10a and the second wiring 10b of the right COF 3b, respectively. This panel-side transmission wiring 13 is composed of two sets of wiring arranged not to cross each other. The image signal supplied from the upper set of transmission wiring 13 is input into the left LC driving IC 8ba, while the image signal supplied from the lower set of transmission wiring 13 is input into the right LC driving IC 8bb.

Next, the multi-chip type COFs shown in FIG. 13 will be described. Each of the left and right source COFs 3a and 3b shown in FIG. 13 includes two LC driving ICs 8aa and 8ab (8ba and 8bb) mounted on an insulating thin film base and four sets of wiring 10a, 10b, 10c and 10d. The first wiring 10a, which is the innermost one among the four sets of wiring 10a to 10d, is electrically connected to the right LC driving IC 8ab (8bb) at a spare signal output point 16b. The second wiring 10b, which is the second innermost one, extends under the right LC driving IC 8ab (8bb) and is connected to the left LC driving IC 8aa (8ba) at a spare signal output point 16a. The remaining sets of third and fourth wiring 10c and 10d extend in a roughly U shape as viewed from top with both ends at the periphery of the insulating base. That is to say, two sets of wiring 10a and 10b among the four sets of wiring 10a, 10b, 10c and 10d are element-connected wiring, while the remaining two sets of wiring 10c and 10d are non-connected wiring.

Each of the source COFs 3a and 3b has spare signal input points 17a and 17b for inputting a spare signal into the two LC driving ICs 8aa and 8ab (8ba and 8bb), COF-side spare wiring 19a and 19b for connecting panel-side spare wiring 18a and 18b and the input points 17a and 17b, and the COF-side COM wiring 21 connected to the panel-side COM wiring 20.

The wiring structure on the LC panel will be described. For transfer of a spare signal from the left source COF 3a to the right source COF 3b, these COFs are connected via panel-side transmission wiring 13a and 13b. Specifically, the two sets of transmission wiring 13a and 13b are routed on the panel so that the first wiring 10a and the second wiring 10b of the left COF 3a permitting output of a spare signal are connected to the third wiring 10c and the fourth wiring 10d of the right COF 3b having no spare signal output point.

In this embodiment, as in Embodiments 1 and 2, the LC driving ICs 8aa, 8ab, 8ba and 8bb having the same structure and the source COFs 3a and 3b having the same structure can be used for input of individual external signals (spare signals) into the LC driving ICs (or output thereof from the LC driving ICs) via separate wiring lines. In addition, in this embodiment, in which each of the COFs 3a and 3b has two LC driving ICs 8aa and 8ab (8ba and 8bb), the number of lines of the panel-side transmission wiring 13 for connecting the COFs 3a and 3b can be reduced. In general, the panel-side wiring is high in resistance because the wiring thickness is small compared with that of the COF-side wiring. Therefore, if the number of lines of panel-side wiring is large, the connection resistance will become very high, and this degrades signals supplied to the LC driving ICs. As a result, the LC driving ICs may fail to operate normally. In this embodiment, in which the number of lines of the panel-side wiring 13 can be reduced, the wiring resistance can be made smaller than those in Embodiment 1 and 2. Therefore, signals supplied from the signal input FPC 5 can be more suppressed from degrading, and the number of LC driving ICs 8 drivable by one FPC 5 can be increased.

In FIGS. 12 and 13, two LC driving ICs were mounted on each of the COFs 3a and 3b. Alternatively, three or more LC driving ICs may be mounted on each COF.

Embodiment 8

In all the source COFs 3 in Embodiments 1 to 7, the connection terminals of the COF-side wiring groups 10 are placed on one periphery (upper periphery as viewed from the figure) of the thin film base (insulating base). To connect such terminals of the adjacent source COFs 3, the transmission wiring 13 is routed in a roughly U shape as viewed from top. The source COFs 3 in this embodiment has wiring groups 10 routed in a roughly Z shape as viewed from top, so that the connection terminals of the adjacent source COFs 3 face each other.

Figure 14:
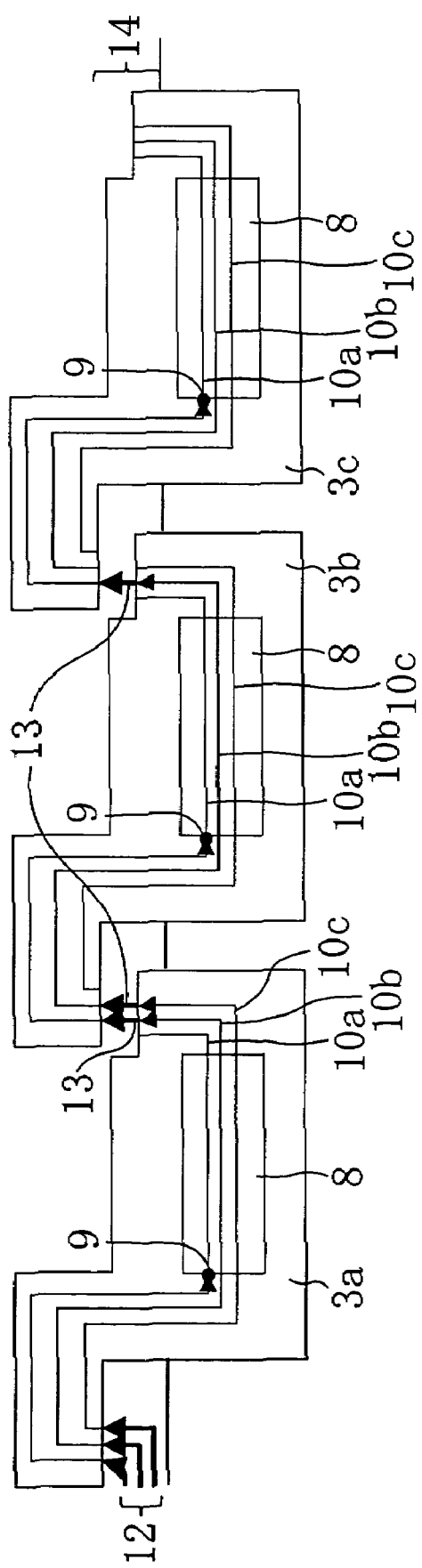
FIG. 14 is a schematic view illustrating a wiring structure in Embodiment 8.
Figure 15:
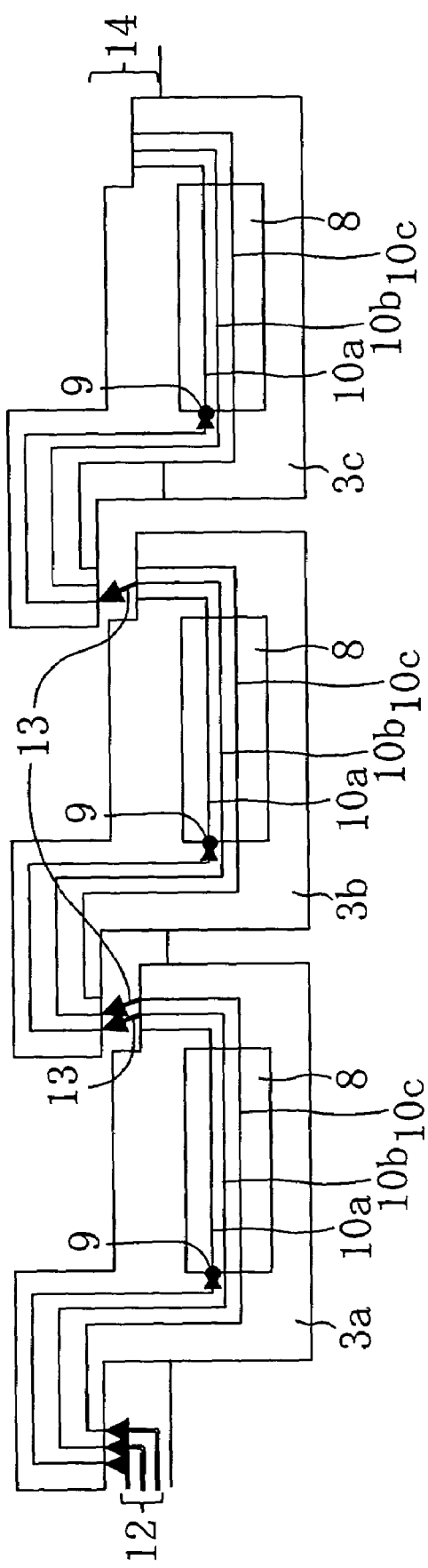
FIG. 15 is a schematic view illustrating another wiring structure in Embodiment 8.
Figure 17A:
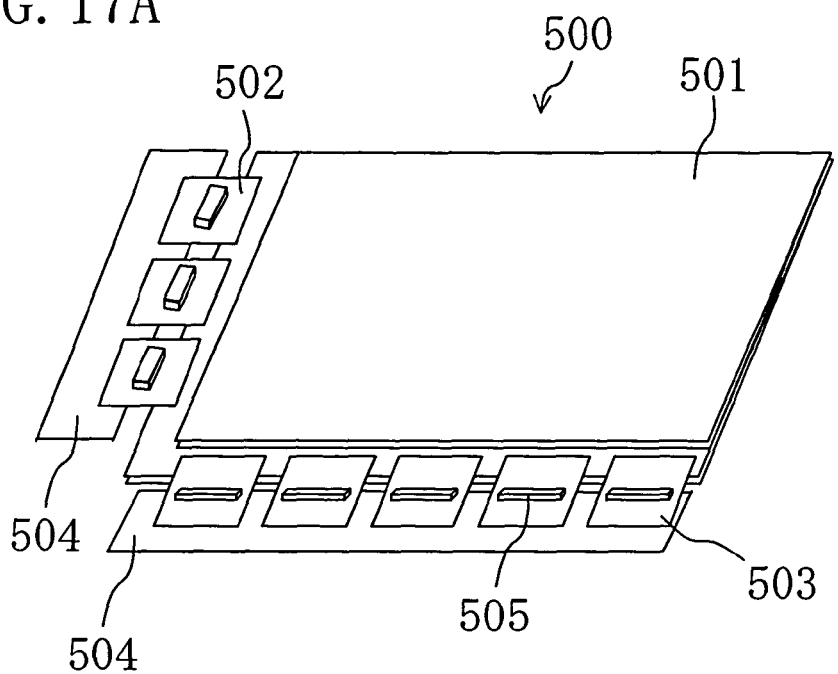
FIG. 17A is a diagrammatic perspective view of a TCP-mode LCD device.
Figure 17B:
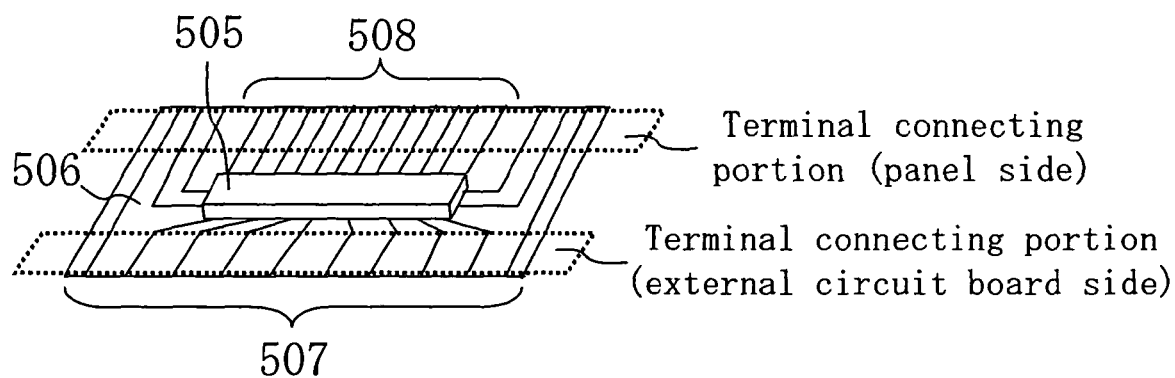
FIG. 17B is a diagrammatic perspective view of a gate TCP 502/source TCP 503.
Figure 18:
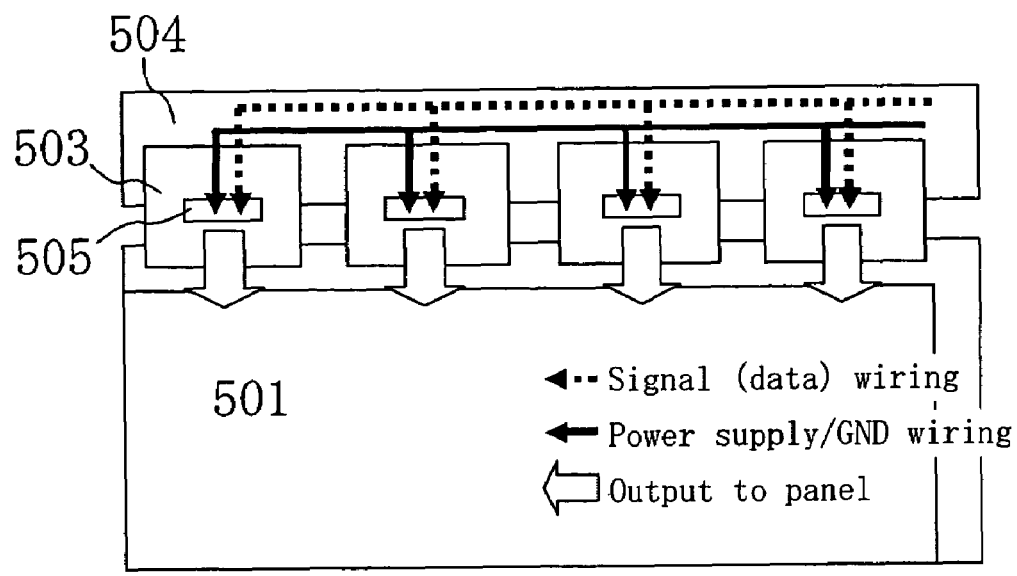
FIG. 18 is a view demonstrating signal input of a TCP-mode LCD device.
Figure 19:
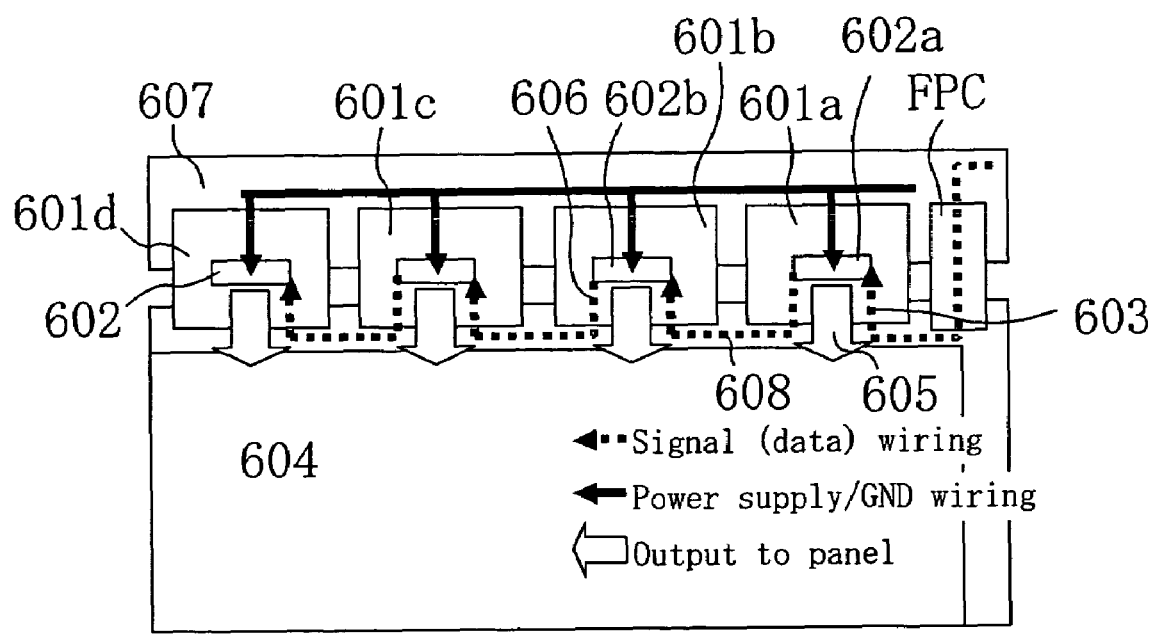
FIG. 19 is a view demonstrating signal input of an LCD device of a signal propagation mode.

FIGS. 14 and 15 are schematic views illustrating wiring structures in this embodiment. This embodiment is an alteration to Embodiment 1 shown in FIG. 2. In each of the source COFs 3a, 3b and 3c shown in FIGS. 14 and 15, a portion of the wiring group 10 near one terminal is routed in a roughly U shape as viewed from top. In the illustrated examples, the left portion of the wiring group 10 with respect to the IC driving IC 8 is routed in a roughly U shape. That is to say, each of the source COF 3a, 3b and 3c has the wiring group 10 in a roughly Z shape.

The source COFs 3a, 3b and 3c are electrically connected to one another via the panel-side transmission wiring 13, as in Embodiment 1. The wiring groups 10 of the adjacent source COFs are connected in displacement by one set of wiring by displacing one source COF in FIG. 14 and by displacing the panel-side transmission wiring 13 in FIG. 15. Specifically, the middle wiring 10b and the lower wiring 10c of the left source COF 3a are electrically connected to the upper wiring 10a and the middle wiring 10b of the middle source COF 3b, respectively. The middle wiring 10b of the middle source COF 3b is electrically connected to the upper wiring 10a of the right source COF 3c.

FIG. 16 is a schematic view illustrating an alteration to this embodiment. In the source COFs 3a, 3b and 3c shown in FIGS. 14 and 15, only the portion of the wiring group 10 near one terminal is routed in a roughly U shape. In FIG. 16, the portions of the wiring group 10 near both terminals are routed in a roughly U shape in the left and right source COFs 3a and 3c. The middle source COF 3b interposed between the left and right source COFs 3a and 3c has the same wiring structure as the source COFs 3 shown in FIG. 2, having no roughly U shaped portion in the connection region 14. The middle source COF 3b has only two sets of wiring, the upper wiring 10a and the lower wiring 10b. The middle wiring 10b and the lower wiring 10c of the left source COF 3a are electrically connected to the upper wiring 10a and the lower wiring 10b of the middle source COF 3b, respectively, and the lower wiring 10b of the middle source COF 3b is electrically connected to the upper wiring 10a of the right source COF 3c.

In this embodiment and its alteration, the distance between the connection terminals of the adjacent source COFs 3a and 3b, for example, can be shortened. In other words, short panel-side transmission wiring 13 can be used to electrically connect the adjacent COFs 3. As described in Embodiment 7, in general, the panel-side wiring is high in resistance because the wiring thickness is small compared with that of the COF-side wiring. Therefore, use of a long-routed panel-side transmission wiring 13 for electrical connection between the adjacent COFs 3 will increase the resistance value between the adjacent COFs 3. This degrades signals supplied from the signal input FPC 5 to the LC driving ICs 8, and as a result, the LC driving ICs may fail to operate normally. In this embodiment, in which the panel-side transmission wiring 13 can be shortened, the wiring resistance can be made smaller than those in Embodiments 1 to 7. Therefore, signals supplied from the signal input FPC 5 can be more suppressed from degrading, and the number of LC driving ICs 8 drivable by one FPC 5 can be increased.

The portion of the upper wiring 10a downstream the image signal input point 9 (right portion with respect to the input point 9), which is not used, may be omitted. In this embodiment, in each of the source COFs 3a, 3b and 3c, the left portion of the wiring group is 10 with respect to the LC driving IC 8 was routed in a roughly U shape. Alternatively, the right portion of the wiring group 10 may be routed in a roughly U shape.

Other embodiments

In Embodiments 1 to 8, the source COFs 3 were described. The gate COFs 4 may have a similar wiring structure. The COFs were used as the wiring boards in Embodiments 1 to 8. Alternatively, chips on glass (COGs) and TCPs may be used as the wiring boards. The COFs may be connected to the display panel by face-up bonding or face-down bonding.

In Embodiments 1 to 8, at least one end of the element-connected wiring is located inside or outside both ends of the non-connected wiring. In other words, the innermost (or outermost) wiring is the element-connected wiring. Alternatively, the element-connected wiring may be interposed between a plurality of sets of non-connected wiring. In other words, the element-connected wiring may not necessarily be placed innermost or outermost.

In Embodiments 1 to 8, TFTs were used as the switching elements. Alternatively, two-terminal elements such as metal insulator metal (MIM) elements and other three-terminal elements may be used. In Embodiments 1 to 8, the display panel was active-matrix driven. The present invention can also be applied to passive-matrix driven display panels.

The display device of the present invention can be a liquid crystal display device, organic and inorganic EL display devices, a plasma display device and the like. The wiring board of the present invention can be COF, COG, TCP and the like.

According to the display device of the present invention, signals to be input into driving circuit elements or signals output from driving circuit elements are allowed to propagate through separate wiring lines. This can suppress increase of the clock frequency of signals.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A display device comprising a display panel and a plurality of wiring boards placed along a periphery of the display panel,
   wherein the display panel has panel-side connection wiring for electrically connecting a first wiring board and a second wiring board adjacent to each other among the plurality of wiring boards,
   each of the plurality of wiring boards has an insulating base, a board-side wiring group running on the insulating base, and at least one driving circuit element for driving the display panel,
   the board-side wiring group is composed of element-connected wiring electrically connected to the driving circuit element, first non-connected wiring having no electrical connection to the driving circuit element and second non-connected wiring having no electrical connection to the driving circuit element, and
   the panel-side connection wiring is formed so that the element-connected wiring of the first wiring board and the first non-connected wiring of the second wiring board are electrically connected to each other and so that the first non-connecting wiring of the first wiring board is connected to the second non-connecting wiring of the second wiring board and so that the element-connected wiring of the second wiring board is not electrically connected to the board-side wiring group of the first wiring board,
   wherein the plurality of wiring boards have wiring patterns identical in board-side wiring group.

2. The display device of claim 1, wherein a plurality of lines constituting the board-side wiring group run on the insulating base without crossing each other,
   the non-connected wiring is in a roughly U shape as viewed from top with both ends at the periphery of the insulating base, and
   at least one end of the element-connected wiring is located inside or outside both ends of the non-connected wiring at the periphery of the insulating base, or the element-connected wiring is interposed between a plurality of lines of the non-connected wiring.

3. The display device of claim 2, wherein the non-connected wiring has another roughly U shape as viewed from top in at least a portion near one end extending in a direction away from the other end.

4. The display device of claim 1, wherein each of the plurality of wiring boards has n or n+1 sets of lines that constitute the board-side wiring group and are involved in signal transmission where n is the total number of driving circuit elements of the plurality of wiring boards (n is a natural number equal to or more than 2).

5. The display device of claim 1, wherein each wiring board further has board-side spare wiring electrically connected to the driving circuit element,
   the display panel further has gate lines, source lines crossing the gate lines, switching elements electrically connected to the gate lines and the source lines, pixel electrodes connected to the gate lines and the source lines via the switching elements, and panel-side spare wiring electrically connected to the board-side spare wiring, and the panel-side spare wiring crosses the source lines via an insulating film near both ends of the source lines.

6. The display device of claim 1, wherein the display panel is a liquid crystal panel.

7. The wiring board provided for the display device of claim 1.

8. The display panel provided for the display device of claim 2.

9. A display device comprising:

a display panel having panel side connection wiring;

a first wiring board having an insulating base, a driving circuit element for driving the display panel, a first wiring path connected to the driving circuit element, a second wiring path and a third wiring path; and a second wiring board identical to the first wiring board and having a first wiring path identical to the first wiring path of the first wiring board connected to the driving circuit element, a second wiring path identical to the second wiring path of the first wiring board, and a third wiring path identical to the third wiring path of the first wiring board;

wherein the panel-side connection wiring connects the second wiring path of the first wiring board to the first wiring path of the second wiring board and connects the third wiring path of the first wiring board to the second wiring path of the second wiring board.

10. The display device of claim 9, wherein in the panel-side connection wiring, none of the first, second and third wiring paths of the second board are connected to the first wiring path of the first board.

* * * * *

UNITED STATES PATENT AND TRADEMARK OFFICE
CERTIFICATE OF CORRECTION

| | | |
|---|---|---|
| PATENT NO. | : 7,283,193 B2 | Page 1 of 1 |
| APPLICATION NO. | : 10/662453 | |
| DATED | : October 16, 2007 | |
| INVENTOR(S) | : Mitsuhiro Sugimoto et al. | |

It is certified that error appears in the above-identified patent and that said Letters Patent is hereby corrected as shown below:

Title Page

Under reference numeral (56) "References Cited" the following is inserted:

5,893,623          04/1999          Muramatsu

Signed and Sealed this

Nineteenth Day of August, 2008

JON W. DUDAS
*Director of the United States Patent and Trademark Office*